United States Patent
Carballo et al.

(10) Patent No.: US 6,621,358 B2
(45) Date of Patent: Sep. 16, 2003

(54) DIFFERENTIAL VOLTAGE CONTROLLED OSCILLATOR, AND METHOD THEREFOR

(75) Inventors: Juan-Antonio Carballo, Austin, TX (US); David William Boerstler, Round Rock, TX (US); Jeffrey L. Burns, Austin, TX (US); Ivan Vo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/015,384

(22) Filed: Dec. 17, 2001

(65) Prior Publication Data

US 2003/0112082 A1 Jun. 19, 2003

(51) Int. Cl.[7] .............................. H03B 5/00; H03B 5/24
(52) U.S. Cl. ...................................... 331/57; 331/177 R
(58) Field of Search ......................... 331/34, 57, 177 R

(56) References Cited

U.S. PATENT DOCUMENTS

| | | |
|---|---|---|
| 4,105,950 A | 8/1978 | Dingwall |
| 5,568,103 A | 10/1996 | Nakashima et al. |
| 5,757,240 A | 5/1998 | Boerstler et al. |
| 5,801,524 A | 9/1998 | Boerstler |
| 6,353,369 B1 * | 3/2002 | Boerstler ...................... 331/57 |
| 6,529,084 B1 * | 3/2003 | Boerstler et al. ............. 331/57 |

OTHER PUBLICATIONS

U.S. patent application Ser. No. 09/726,282, Boerstler et al., filed Nov. 30, 2000.
J. Cho, "Digitally–controlled PLL with Pulse Width Detection Mechanism for Error Correction", ISSCC Dig. Tech. Papers, Feb. 1997, pp. 334–335.
J. Maneatis et al., "Precise Delay Generation Using Coupled Oscillators", IEEE Journal of Solid–State Circuits, vol. 28, No. 12, Dec. 1993, pp. 1273–1282.
B. Razavi, *Design of Analog CMOS Integrated Circuits*, McGraw Hill, 2000, pp. 484–525.

* cited by examiner

*Primary Examiner*—David C. Mis
(74) *Attorney, Agent, or Firm*—Anthony V. S. England; Casimer K. Salys

(57) ABSTRACT

In a first form, a voltage controlled oscillator includes delay cells connected in a ring, and control elements connected to selectively bypass respective sets of the delay cells. The delay cells are operable to receive respective differential inputs and to generate inverted outputs. The control elements are operable to receive respective differential inputs and to generate non-inverted outputs with variable delays. The control element delays are variable responsive to respective differential control voltages.

22 Claims, 2 Drawing Sheets

DIFFERENTIAL VOLTAGE CONTROLLED OSCILLATOR, AND METHOD THEREFOR

BACKGROUND

1. Field of the Invention

The present invention relates to voltage controlled oscillators, and more particularly to differential voltage controlled oscillators.

2. Related Art

Voltage controlled oscillators are very important for applications such as processor clock generation and distribution, communications, system synchronization, and frequency synthesis. The trend among these applications demands higher frequency, lower power, higher density and lower jitter voltage controlled oscillators.

Current designs tend to achieve improvements in some of these parameters at the expense of others. For example, a conventional current starved ring oscillator typically has three or four levels of stacking, but extreme sensitivity to noise due to very high gain. Also, this type of conventional oscillator tends to be very sensitive to process and environmental variability, and to have high jitter. Further, some of these designs do not provide equally staggered phases. Conventional delay interpolating oscillators are capable of very low jitter due to low gain and low noise sensitivity, but they tend to be inherently limited in maximum frequency range, and are difficult to build in less than 4 levels. Conventional multiphase oscillators offer advantages by pipelining operations using equally spaced phases at lower frequencies, but control mechanisms in delay interpolators tend to introduce offsets from the ideal phase spacing. LC-based multiphase oscillators are capable of high frequency and extremely low jitter, but tend to be difficult to integrate and model and have very low tuning ranges.

Therefore a need exists for an improved voltage control oscillator.

SUMMARY

The forgoing need is addressed, in a first form, by a voltage controlled oscillator that includes delay cells connected in a ring, and control elements connected to selectively bypass respective sets of the delay cells. The delay cells are operable to receive respective differential inputs and to generate inverted outputs. The control elements are operable to receive respective differential inputs and to generate non-inverted outputs with variable delays. The control element delays are variable responsive to respective differential control voltages.

Objects and advantages of the invention will become apparent upon reading the following detailed description and upon reference to the accompanying drawings.

DETAILED DESCRIPTION OF THE PREFERRED EMBODIMENT

The claims at the end of this application set out novel features which applicants believe are characteristic of the invention. The invention, a preferred mode of use, objectives and advantages, will best be understood by reference to the following detailed description of an illustrative embodiment read in conjunction with the accompanying drawings.

Figure 1:
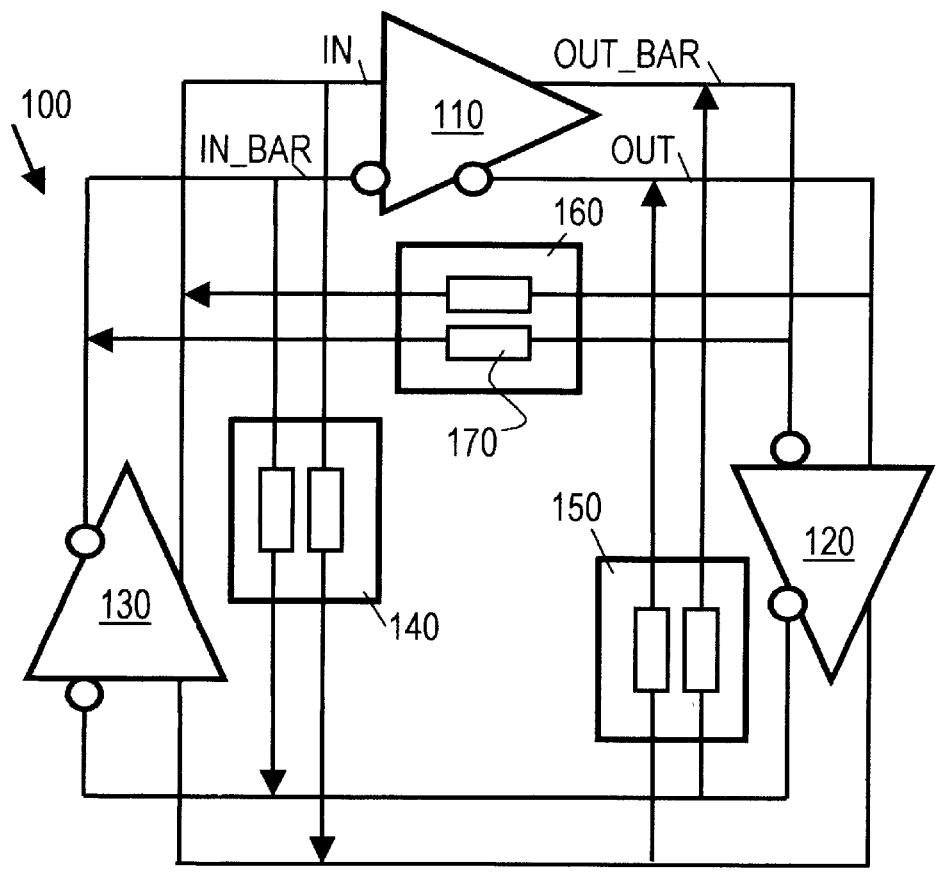
FIG. 1 illustrates a three-stage, differential, voltage controlled oscillator, according to an embodiment.

Referring now to FIG. 1, a three-stage, differential, voltage controlled oscillator 100 is illustrated, according to an embodiment. The oscillator 100 has a first differential delay cell 110, a second differential delay cell 120 and a third differential delay cell 130 with connections among the cells so that the cells are connected in a ring. That is, there is a connection for differential outputs, out and out_bar, of the first delay cell 110 to the differential inputs, in and in_bar of the second delay cell 120. Likewise, there is a connection for the differential outputs of the second delay cell 120 to the differential inputs of the third delay cell 130, and there is a connection for the differential outputs of the third delay cell 130 to the differential inputs of the first delay cell 110. The delay cells 110, etc. logically invert their respective differential inputs.

The oscillator 100 also includes three non-inverting control elements, 140, 150 and 160. Each one of the control elements is coupled to "bypass" a set of two of the delay cells. (The term "bypass" will be further explained herein below.) Specifically, there are respective connections for differential inputs of control element 140 to the differential inputs of delay cell 110 and differential outputs of control element 140 to the differential outputs of delay cell 120, so that control element 140 may be controlled to bypass delay cells 110 and 120. Likewise, there are connections for the differential inputs of control element 150 to the differential inputs of delay cell 130 and the differential outputs of control element 150 to the differential outputs of delay cell 110, permitting the control element 150 to bypass delay cells 130 and 110. Finally, there are connections for the differential inputs of control element 160 to the differential inputs of delay cell 120 and the differential outputs of control element 160 to the differential outputs of delay cell 130, permitting the control element 160 to bypass delay cells 120 and 130.

In the embodiment, the control elements 140, 150 and 160 each consist solely of a pair of pass gates. A typical one of the pass gates is labelled 170 in FIG. 1. The pair of pass gates 170 of a control element 140, etc. receive respective first and second voltages of a differential control voltage (not shown in FIG. 1) for the control element. Details of pass gate 170 are shown in FIG's 2A and 2B, according to alternative embodiments.

Figure 2A:
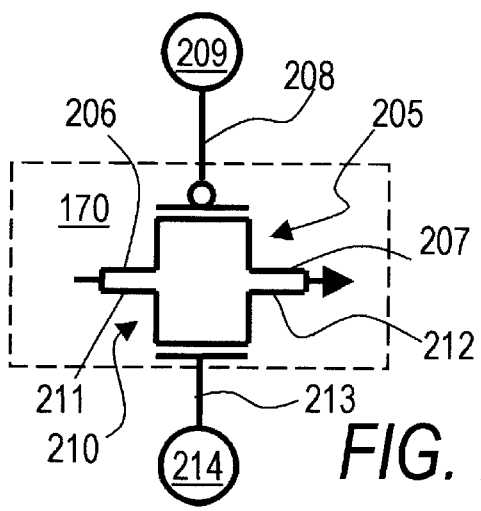
FIG. 2A illustrates a pass gate for a pass gate pair of one of the control elements of FIG. 1, according to a first embodiment.

Referring now to FIG. 2A, a pass gate 170 is illustrated, as typical for a pass gate pair of one of the control elements 140, 150 or 160, according to a first embodiment. In this embodiment, the pass gate includes a P-channel field effect transistor ("PFET") 205 and an N-channel field effect transistor ("NFET") 210 pair. The PFET 205 has a first conducting electrode 206, a second conducting electrode 207 and a gate 208. Likewise, the NFET 210 has a first conducting electrode 211, a second conducting electrode 212 and a gate 213. The first conducting electrodes of each FET are coupled together, as are the second conducting electrodes. The gate 208 of PFET 205 is operable to receive the first voltage 209 of the control element's differential control voltage, while the gate 213 of NFET 210 is operable to receive the second voltage 214 of the control element's differential control voltage, which is reverse polarity with respect to the first voltage 209. The corresponding second pass gate 170 (not shown) of the control element's pass gate pair is also operable to receive the voltages of the differential control voltage.

Figure 2B:
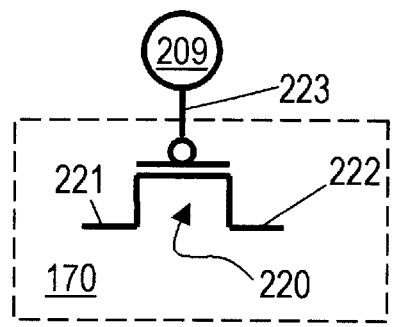
FIG. 2B illustrates a pass gate for a pass gate pair of one of the control elements of FIG. 1, according to a second embodiment.

Referring now to FIG. 2B, a typical pass gate 170 is illustrated, according to a second embodiment. In this embodiment, the pass gate has only a single FET 220, with a first conducting electrode 221, a second conducting electrode 222 and a gate 223. The gate 223 is operable to receive one of the control voltages for the pass gate's associated control element 140, 150 or 160. The corresponding second pass gate 170 (not shown) of the control element's pass gate pair is also operable to receive the differential control voltages.

Figure 3:
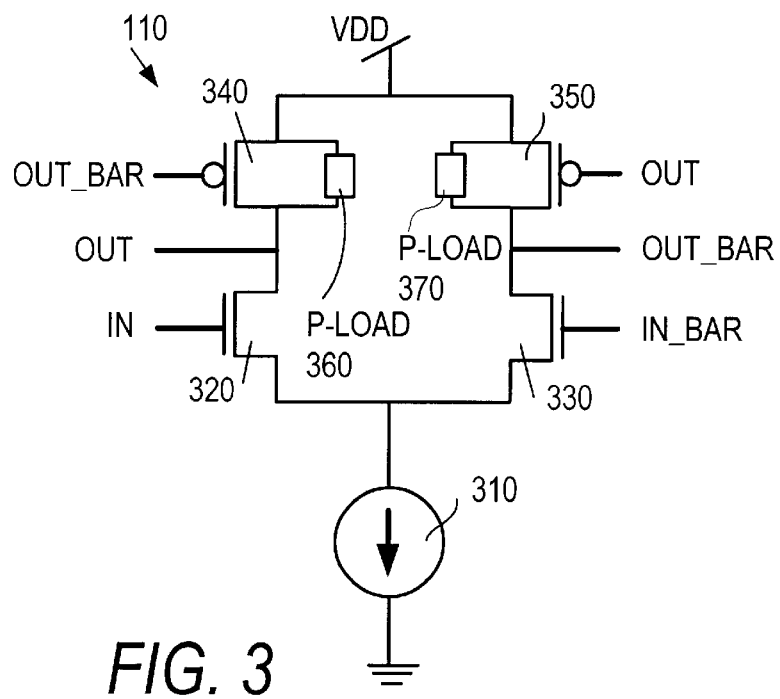
FIG. 3 illustrates a typical delay cell for the oscillator of FIG. 1, according to a first embodiment.

Referring now to FIG. 3, a delay cell 110 is shown, according to a first embodiment. NFET 320 and PFET 340 are connected in series. NFET 330 and PFET 350 are likewise connected in series, which is connected in parallel with the series NFET/PFET 320/340. The source electrodes of the PFET's 340 and 350 are connected to Vdd. A current source 310, circuitry for which is well known in the art, is interposed between ground and the source electrodes of NFET's 320 and 330.

The delay cell 110 is operable to receive an input signal, in, on the gate of NFET 320 and to generate a complementary output, out, on the mutually coupled drain electrodes of NFET 320 and PFET 340. Likewise, the delay cell 110 is operable to receive a complementary input signal, in_bar, on the gate of NFET 330 and to generate an output, out_bar, complementary to the in_bar signal, on the mutually coupled drain electrodes of NFET 330 and PFET 350. The PFET's 340 and 350 are cross coupled to enhance switching speed. That is, the gate of the PFET 340 is coupled to the output, out_bar. Likewise, the gate of the PFET 350 is coupled to the output, out. To reduce supply voltage sensitivity, the inverters of the delay cell 110 have respective p-loads 360 and 370. In the embodiment, the p-loads are diode connected PFET's, that is, the gates of the PFET's are connected to their own drains.

This embodiment of FIG. 3 is "fully" differential. That is, in normal operating mode, disturbances or noise that are common to both differential terminals are completely cancelled. To illllustrate this point, note that the sum of the currents that go through the left and right sides of the delay cell are constant, thanks to the current source. Thus an increase in the common-mode voltage on the inputs (or other disturbance that affects both sides similarly) does not result in an increase in the current through either side, and therefore does not result in a change in the oscillation frequency.

Referring now to FIG. 1 in connection also with FIG. 3, further aspects of operation of the oscillator 100 include the following. Differential signals propagate through the three delay cells 110, etc. connected in a ring, and at least a portion of the signals are controlled to selectively bypass the delay cells. The term "bypass" is used with reference to the propagation path provided by the coupling of a control element from the input of one delay cell to the output of a second delay cell. It should, however, be understood that a control element does not, strictly speaking, entirely bypass its respective set of delay cells, and, correspondingly, the signals propagating around the ring do not entirely bypass the delay cells via the control elements. Rather, as the control voltage on each control element 140, etc. is varied, oscillation frequency varies proportionally as the signal propagation varies through the respective control elements and delay cells. Thus, the delay through each of the control element's set of delay cells is effectively interpolated between the delay of the control element and its associated delay cells, e.g. control element 140 and associated delay cells 110 and 120.

To acheive the proper interpolating effect, according to one design parameter of the embodiment, the transistors of delay cells and control elements are sized so that at the minimum control voltage level for a control element the propagation delay through the control element is no less than the delay through one delay cell, and at the maximum control voltage level the delay through the control element is no more than the delay through two delay cells. That is, outputs of respective delay cells and associated control elements, e.g., 110 and 150, share common output nodes, e.g. "out" in FIG. 1. Although the delay elements of FIG. 3 are amplifiers they do not necessarily overpower their associated control element in driving the voltage on the shared output nodes, due to relative sizes of their transistors, according to the embodiment. For example, transistors of the delay cell 110 are relatively small enough in comparison to certain of the transistors of the control element 150 so that the voltage driven at the "out" node is not unduely dominated by the delay cell 110.

Figure 4:
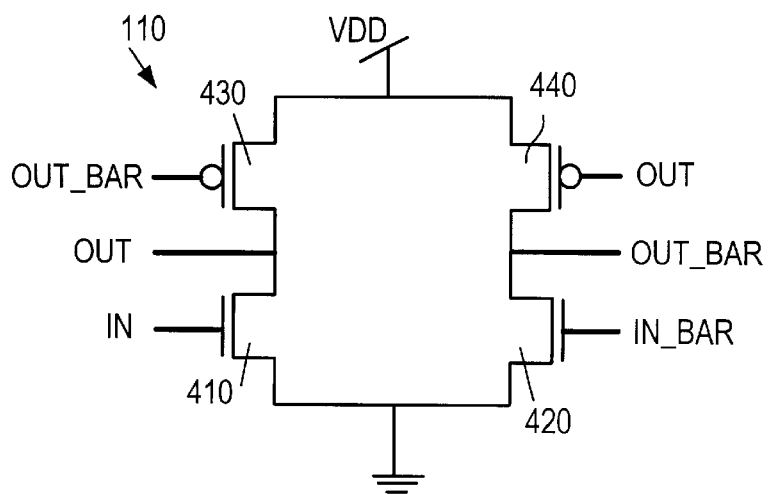
FIG. 4 illustrates another typical delay cell for the oscillator of FIG. 1, according to a second embodiment.

Referring now to FIG. 4, another, simpler delay cell 110 is shown, according to an alternative embodiment. In this delay cell 110, NFET 410 and PFET 430 are connected in series. NFET 420 and PFET 440 are likewise connected in series and connected in parallel with NFET 410/PFET 430. The source electrodes of the PFET's 430 and 440 are connected to Vdd. The source electrodes of NFET's the 410 and 420 are connected to ground.

The delay cell 110 of FIG. 4 is operable to receive an input signal, in, on the gate of NFET 410 and to generate a complementary output, out, on the mutually coupled drain electrodes of NFET 410 and PFET 430. Likewise, the delay cell 110 is operable to receive a complementary input signal, in_bar, on the gate of NFET 420 and to generate an output, out_bar, complementary to the in_bar signal, on the mutually coupled drain electrodes of NFET 420 and PFET 440. As in the delay cell of FIG. 3, the PFET's of the FIG. 4 delay cell 110 are also cross coupled to enhance switching speed. That is, the gate of the PFET 430 is coupled to the output, out_bar, and the gate of the PFET 440 for the second inverter is coupled to the output, out. This delay cell 110 half FIG. 4 is based on SRAM design principles. The cell 110 features a differential configuration where the cross coupled gates of the PFET's work as loads that enhance switching speed and the gates of the NFET's provide both inputs.

The embodiments described herein above provide numerous advantages. The oscillator consumes very low power and has good insensitivity to voltage supply. It provides differential outputs, a feature which improves insensitivity to noise. High frequency is possible with the design due to relatively high swing potential and due to low parasitics resulting from reduced circuit complexity and size. The oscillator can provide multiple equally spaced phases for over sampling or pipeline applications, and has been shown to work in a low voltage environment (1.1 volts). Tuning range can be significantly large with monoticity. Gain and range can be externally controlled, which is important for limiting noise bandwidth and noise susceptibility, factors which often define jitter performance of an oscillator. Gain and range can be controlled during design, by modifying the size of the control pass gates. For example, a larger control device may result in a larger gain and range (up to a point where it results in too high parasitics).

With all the control elements 140, etc. (FIG's 1, 2A and 2B) controlled by a single differential control voltage, this tends to distribute interpolation uniformly around the ring of delay cells 110, etc., (FIG's 1, 3 and 4) which allows good duty cycle and phase linearity. That is, three substantially uniform differential signals may be picked off the outputs of the respective delay cells, and in this circumstance the three will tend to be equally spaced in phase with respect to one another. Alternatively, with the control elements 140, etc. controlled by independent differential control voltages, the phases of the three differential signals can be varied, which is useful for phase tuning in some applications. Also, extremely simple interpolation elements are used in the disclosed embodiments, that is, control elements 140, etc. consisting solely of passgates 170. This results in very low parasitics, which tends to improve many performance parameters, including jitter. This arrangement with just passgates in the control elements results in non-inverting, i.e., monotonic, control elements. This also tends to result in faster signal propagation through the control elements, since it avoids the capacitance of inverter transistor gates in the propagation path.

The delay cell 110 of FIG. 3 is relatively simple, and thus contains low parasitics, so that low jitter and high gain are provided. Also, because it is not stacked high, the cell 110 works with relatively low supply voltage. Furthermore, while the cell 110 can provide full voltage swing, the cell 110 can also provide pseudo-sinusoidal, non-full voltage swing which tends to significantly reduce power consumption. (For example, an oscillator implemented with the cell 110 of FIG. 3 has been shown to consume 2 milliamperes with a 1.2 V supply in a 0.12 micron technology running at over 3 gigahertz. The entire oscillator in this implementation contained only eighteen transistors, and provided six equally spaced phases.) Delay cell transistor sizes are an important factor in acheiving this lower power, non-full swing operation. That is, relatively lower equivalent resistance p-loads and PFET's, reduced-current current sources, and generally lower gain for the delay cell tend to reduce swing. Of course overall operation of the oscillator is affected by the relative sizes of the delay cell and control element transistors, as previously described, so changes in delay cell transistors to reduce swing necessarily require corresponding changes in transistors for control elements.

The delay cell 110 of FIG. 4 can be applied to full swing applications, and due to its extraordinary simplicity has a small size and low parasitics. When correctly sized and buffered, a well-balanced, full swing, rectangular signal is provided by the cell. (An oscillator implemented with the delay cell 110 of FIG. 4 has been shown to consume around 5 milliamperes of worst-case current, with a 1.2 V supply in 0.12 micron technology running at over 3 gigahertz full swing.)

The description of the present embodiment has been presented for purposes of illustration, but is not intended to be exhaustive or to limit the invention to the form disclosed. Many additional aspects, modifications and variations are also contemplated and are intended to be encompassed within the scope of the following claims. For example, in the embodiment described in detail herein the oscillator has three stages. In other embodiments, the oscillator has more stages. Also, in FIG. 3 the current source is interposed between the NFET's and ground. In other embodiments the current source is interposed between the PFET's and the voltage source. In another variaion, to control gain and range after design, multiple input control devices can be put in parallel. By controlling the number of parallel control devices that are turned on or off, gain and range can be modified. For example, when four control pass gates in parallel are turned on, gain will generally be higher than when only one pass gate is on.

What is claimed is:

1. A voltage controlled oscillator comprising:
   delay cells operable to invert differential delay cell input signals;
   control elements operable to receive control element input signals and to responsively generate non-inverted output signals;
   connections for the delay cells to propagate the delay cell signals in a ring; and
   connections for the control elements to selectively bypass respective sets of the delay cells, wherein the control element delays have selectively variable delays, the delays being variable responsive to respective control voltages.

2. The voltage controlled oscillator of claim 1, wherein such a control element comprises a pass gate pair.

3. The voltage controlled oscillator of claim 2, wherein each pass gate of the pass gate pair has a pair of transistors, the first transistor of such a pass gate having a first and second conducting electrode and a first gate, and the second transistor of the pass gate having a third and fourth conducting electrode and a second gate, wherein the gates of the transistor pair are operable to receive respective ones of the differential control voltages for the control element, and the first and third electrodes are coupled to certain of the inputs and the second and fourth electrodes are coupled to certain of the outputs of the control element's respective set of one or more delay cells.

4. The voltage controlled oscillator of claim 2, wherein each pass gate of the pass gate pair has a transistor having a first and second conducting electrode and a first gate, wherein the gate of such a transistor is operable to receive one of the control voltages of the differential control voltages for the control element, and the first electrode is coupled to a certain one of the inputs and the second electrode is coupled to a certain one of the outputs of the control element's respective set of one or more delay cells.

5. The voltage controlled oscillator of claim 1, wherein the control elements consist solely of respective pairs of pass gates, wherein the gates of the pass gates are operable to receive respective ones of the differential control voltages.

6. The voltage controlled oscillator of claim 1, wherein the delay cells comprise respective differential amplifiers.

7. The voltage controlled oscillator of claim 6, wherein such a differential amplifier comprises a first pair of series-connected transistors coupled in parallel with a second pair of series-connected transistors, and has a current source interposed between the differential amplifier transistors and a voltage source or ground.

8. The voltage controlled oscillator of claim 7, wherein the differential amplifier comprises a pair of loads coupled in parallel with certain respective ones of the differential amplifier transistors.

9. The voltage controlled oscillator of claim 1, wherein the delay cells comprise a first pair of series-connected transistors coupled in parallel with a second pair of series-connected transistors, with a gate of one of the transistors in the first pair coupled to an electrode of at least one of the transistors in the second pair, and a gate of one of the transistors in the second pair coupled to an electrode of at least one of the transistors in the first pair.

10. The voltage controlled oscillator of claim 1, wherein the delay cells consist solely a first pair of series-connected transistors coupled in parallel with a second pair of series-connected transistors, with a gate of one of the transistors in the first pair coupled to an electrode of at least one of the transistors in the second pair, and a gate of one of the transistors in the second pair coupled to an electrode of at least one of the transistors in the first pair.

11. A voltage controlled oscillator comprising:

delay cells connected in a ring, wherein such a delay cell comprises a first pair of series-connected transistors coupled in parallel with a second pair of series-connected transistors, with a gate of one of the transistors in the first pair cross coupled to an electrode of at least one of the transistors in the second pair, and a gate of one of the transistors in the second pair cross coupled to an electrode of at least one of the transistors in the first pair, and the delay cell is operable to receive differential inputs and generate differential outputs; and control elements connected to selectively bypass respective sets of the delay cells, wherein the control elements are non-inverting and are operable to receive respective differential inputs and outputs and to provide variable delays, the control element delays being variable responsive to respective differential control voltages.

12. The voltage controlled oscillator of claim 11, wherein the control elements consist solely of respective pairs of pass gates, the gates of the pass gates being operable to receive the differential control voltages for the respective sets of delay cells, and wherein each delay cell's cross coupled transistor pairs have a respective current source interposed between the transistor pairs and a voltage source or ground, and has a pair of loads coupled in parallel with certain respective transistors of the transistor pairs.

13. A method for a voltage controlled oscillator comprising the steps of:

a) propagating differential signals through delay cells connected in a ring, wherein the delay cells have respective differential inputs and outputs;

b) selectively propagating a portion of the differential signals through control elements connected to selectively bypass respective sets of the delay cells and wherein the control elements have respective differential inputs and outputs and selectively variable delays; and c) varying the control element delays responsive to respective differential control voltages.

14. The method of claim 13, wherein such a control element comprises a pass gate pair.

15. The method of claim 14, wherein each pass gate of the pass gate pair has a pair of transistors, the first transistor of such a pass gate having a first and second conducting electrode and a first gate, and the second transistor of the pass gate having a third and fourth conducting electrode and a second gate, the first and third electrodes being coupled to certain of the inputs and the second and fourth electrodes being coupled to certain of the outputs of the control element's respective set of one or more delay cells, and wherein step c) comprises receiving respective ones of the differential control voltages for the control element by the gates of the transistor pair.

16. The of method claim 14, wherein each pass gate of the pass gate pair has a transistor having a first and second conducting electrode and a first gate, the first electrode being coupled to a certain one of the inputs and the second electrode being coupled to a certain one of the outputs of the control element's respective set of one or more delay cells, and wherein step c) comprises receiving one of the control voltages of the differential control voltages for the control element by the gate of such a transistor.

17. The method of claim 13, wherein the control elements consist solely of respective pairs of pass gates, and wherein the step c) comprises receive respective ones of the differential control voltages by gates of the pass gates.

18. The method of claim 13, wherein the delay cells comprise respective differential amplifiers.

19. The method of claim 18, wherein such a differential amplifier comprises a first pair of series-connected transistors coupled in parallel with a second pair of series-connected transistors, and has a current source interposed between the differential amplifier transistors and a voltage source or ground.

20. The method of claim 19, wherein the differential amplifier comprises a pair of loads coupled in parallel with certain respective transistors of the differential amplifier.

21. The method of claim 13, wherein the delay cells comprise a first pair of series-connected transistors coupled in parallel with a second pair of series-connected transistors, with a gate of one of the transistors in the first pair coupled to an electrode of at least one of the transistors in the second pair, and a gate of one of the transistors in the second pair coupled to an electrode of at least one of the transistors in the first pair.

22. The method of claim 13, wherein the delay cells consist solely of a first pair of series-connected transistors coupled in parallel with a second pair of series-connected transistors, with a gate of one of the transistors in the first pair coupled to an electrode of at least one of the transistors in the second pair, and a gate of one of the transistors in the second pair coupled to an electrode of at least one of the transistors in the first pair.

* * * * *